(12) United States Patent
Hulslander (10) Patent No.: US 8,844,707 B2
(45) Date of Patent: Sep. 30, 2014

(54) TRANSFER SYSTEM FOR A PRODUCTION LINE

(75) Inventor: Brian Hulslander, West Bloomfield, MI (US)

(73) Assignee: Noble Engineering Company, Inc., Shelby Township, MI (US)

( * ) Notice: Subject to any disclaimer, the term of this patent is extended or adjusted under 35 U.S.C. 154(b) by 0 days.

(21) Appl. No.: 13/432,653

(22) Filed: Mar. 28, 2012

(65) Prior Publication Data

US 2012/0251273 A1  Oct. 4, 2012

Related U.S. Application Data

(60) Provisional application No. 61/471,318, filed on Apr. 4, 2011.

(30) Foreign Application Priority Data

Apr. 5, 2011  (CA) ...................................... 2736283

(51) Int. Cl.
*B23Q 7/00* (2006.01)
*B25J 9/02* (2006.01)
*B25J 5/02* (2006.01)
*B23P 19/00* (2006.01)
*B25J 9/00* (2006.01)
*H01L 21/687* (2006.01)
*H01L 21/67* (2006.01)

(52) U.S. Cl.
CPC ................ *B25J 9/0084* (2013.01); *B25J 9/026* (2013.01); *B25J 5/02* (2013.01); *B23P 19/001* (2013.01); *H01L 21/68707* (2013.01); *H01L 21/67173* (2013.01)
USPC ................ 198/468.2; 198/468.01; 198/468.6; 198/346.2; 198/346.3

(58) Field of Classification Search
USPC ........ 198/468.01, 468.2, 468.6, 346.2, 346.3; 414/222.13, 277, 281, 282, 590, 591, 414/751.1; 29/429, 430, 431, 822, 823, 29/824, 33 P
See application file for complete search history.

(56) References Cited

U.S. PATENT DOCUMENTS

| | | | | |
|---|---|---|---|---|
| 4,251,957 A | * | 2/1981 | Terahara | 451/334 |
| 4,359,153 A | | 11/1982 | Gerben et al. | |
| 4,550,682 A | * | 11/1985 | Juve et al. | 118/425 |
| 4,785,657 A | | 11/1988 | Votava | |
| 5,159,827 A | | 11/1992 | Shiraishi et al. | |
| 5,549,442 A | * | 8/1996 | Crorey | 414/751.1 |
| 7,410,046 B2 | | 8/2008 | Shiroza | |
| 7,740,122 B2 | * | 6/2010 | Usui | 198/346.3 |
| 8,105,005 B2 | * | 1/2012 | Yoshida et al. | 414/282 |
| 2005/0036879 A1 | * | 2/2005 | Jhaveri et al. | 414/751.1 |
| 2009/0148261 A1 | * | 6/2009 | Hirasawa et al. | 414/277 |

* cited by examiner

*Primary Examiner* — Leslie A Nicholson, III
(74) *Attorney, Agent, or Firm* — Howard & Howard Attorneys PLLC (57) ABSTRACT

A transfer system transfers a workpiece between stations of a production line spaced along a transfer axis. The transfer system comprises a frame having a main beam extending along the transfer axis. A plurality of transfer heads are spaced along the main beam with each of the transfer heads configured to independently move along the main beam along the transfer axis and relative to the main beam along a lift axis orthogonal to the transfer axis and a clamp axis orthogonal to the transfer and lift axes to accommodate for variation in spacing between each of the stations. Each of the transfer heads are suspended from the main beam and extend downwardly from the main beam beneath the main beam so that the transfer head is selectively moved outwardly, upwardly, and sideways away from the stations to provide access to the stations from the substrate.

1 Claim, 9 Drawing Sheets

TRANSFER SYSTEM FOR A PRODUCTION LINE

CROSS-REFERENCE TO RELATED APPLICATIONS

The subject patent application claims priority to and all the benefits of U.S. Provisional Patent Application No. 61/471,318 filed Apr. 4, 2011 and Canadian Patent Application No. 2,736,283 filed Apr. 5, 2011, which are both incorporated herein by reference.

BACKGROUND OF THE INVENTION

1. Field of the Invention

The present invention includes a transfer system for a production line and, more specifically, a transfer system that transfers workpieces between a plurality of stations of a production line.

2. Description of the Related Art

A production line includes a plurality of stations for performing a manufacturing process on a workpiece. Each station performs a different step of the manufacturing process on the workpiece and a transfer system transfers workpieces between the stations. The transfer system reaches into each station, engages the workpiece, and moves the workpiece to the adjacent station.

A common goal is to increase the production output of the production line, i.e., to reduce the amount of time required to perform the complete manufacturing process on the workpiece. Many factors affect the total time required to perform the entire manufacturing process on a single workpiece. Inefficiencies in the design and operation of the transfer system disadvantageously slow the production output of the production line. In addition, periodic maintenance and repair to the production line and the transfer system idles the production line, thereby disadvantageously reducing the production output of the production line.

SUMMARY OF THE INVENTION AND ADVANTAGES

The present invention includes a transfer system for transferring a workpiece between stations of a production line spaced along a transfer axis. The transfer system comprises a frame including at least one riser for connection to an underlying substrate and a main beam fixed to the riser and extending transversely to the riser along the transfer axis. A plurality of transfer heads are spaced along the main beam with each of the transfer heads configured to independently move along the main beam along the transfer axis and relative to the main beam along a lift axis orthogonal to the transfer axis and a clamp axis orthogonal to the transfer and lift axes to accommodate for variation in spacing between each of the stations. Each of the transfer heads are suspended from the main beam and extend downwardly from the main beam beneath the main beam so that the transfer head is selectively moved outwardly, upwardly, and sideways away from the stations to provide access to the stations from the substrate.

Since each transfer head independently moves along the transfer axis, the lift axis, and the clamp axis, each transfer head can accommodate for variations in spacing between each station. In other words, each station can be installed in a factory without aligning the stations with each other along the three axes. By eliminating the need for aligning each station along the three axes, assembly time, installation time and manpower are reduced thereby reducing costs. The independent movement of each transfer head also increases the overall speed of the transfer system. In other words, all of the transfer heads can simultaneously move along the various axes without delaying movement of the other transfer heads.

Further, since each of the transfer heads are suspended from the main beam and extend downwardly beneath the main beam, each transfer head can be conveniently cleared away from the stations to provide quick and easy access to the stations from the substrate. When the transfer heads are cleared away from the stations, an operator can easily approach the stations by walking on the substrate. Similarly, when the transfer heads are cleared away from the stations, tools and equipment can be brought to the stations along the substrate for maintenance and/or repair of the substrate. Access to the stations also allows for easy station changes, e.g., replacing one mold with another. Since the transfer heads are suspended overhead, the substrate in front of the stations is typically flat for ease of access.

BRIEF DESCRIPTION OF THE DRAWINGS

Other advantages of the present invention will be readily appreciated, as the same becomes better understood by reference to the following detailed description when considered in connection with the accompanying drawings wherein.

DETAILED DESCRIPTION

Referring to the Figures, wherein like numerals indicate like parts throughout the several views, a production line 10 is generally shown in FIGS. 1A-3. The production line 10 typically includes a plurality of stations 12 for performing a manufacturing process to a workpiece 14 and a transfer system 16 for transferring workpieces 14 between the stations 12. The production line 10 can be configured to perform any type of manufacturing process on the workpieces and the manufacturing process can include any type of steps and any number of a plurality of steps. The stations 12 can be of any type and the manufacturing process can, for example, deform the workpiece 14 with steps such as, for example, stamping, pressing, cutting, trimming, etc. The transfer system 16 is shown in the production line 10 in FIGS. 1A-3 and is shown in isolation in FIGS. 4-7.

The production line shown for example in FIGS. 1A-3 is press line. The stations 12 of FIGS. 1A-3 are gap frame presses, i.e., individual presses that are spaced from each other and have three open sides to receive the workpiece 14 and the transfer system 16. Each station 12 typically includes its own mold 18 and ram (not shown). However, it should be appreciated that the stations 12 shown in FIGS. 1A-3 are shown for exemplary purposes and the production line 10 can include any type of press/presses without departing from the nature of the present invention. For example, although not shown in the Figures, the production line 10 could include a single press having one or more stations 12 controlled by a single ram, e.g., the single ram simultaneously moves each mold 18.

With reference again to FIGS. 1A-3, the transfer system 16 includes a frame 20 and a plurality of transfer heads 22 moveably disposed on the frame 20. The frame 20 is typically formed of steel but can be formed of any type of suitable material without departing from the nature of the present invention.

The frame 20 typically arches above the stations 12. The frame 20 includes at least one riser 24 and a main beam 26 fixed to the riser 24 and extending transversely to the riser 24 along the transfer axis AT. The risers 24 are configured to arch above the stations 12 to suspend the main beam 26 above the stations 12. Specifically the risers 24 are typically L-shaped to arch above the production line 10 and suspend the main beam 26 above the stations 12, i.e., at a higher vertical level than the stations 12. As shown in the Figures, the frame 20 typically includes a plurality of risers 24 with the main beam 26 extending across the risers 24. Although the frame 20 shown in FIGS. 4-7 includes four risers 24, the frame 20 can include any number of risers 24 without departing from the nature of the present invention. As shown in FIGS. 1A-3, the frame 20 is typically arranged relative to the stations 12 such that the main beam 26 extends across a front end of the stations 12 and the risers 24 are disposed between and/or behind the stations 12.

The frame 20 is configured to be mounted to a substrate 60, such as a floor of a factory, a platform, other supporting structure, etc., independently from the production line 10. Specifically, the risers 24 are mounted to the substrate 60 and typically include bases 28 that that are bolted to the substrate 60. The transfer system 16 is independent from the stations 12, i.e., are manufactured separately from the stations 12 and can be installed before, during, or after the installation of the stations 12. After the installation of the stations 12, the transfer system 16 is calibrated to the stations 12 to ensure proper transfer and placement of the workpieces 14 on the stations 12, as set forth further below.

With reference to FIGS. 4-7, the plurality of transfer heads 22 are spaced from each other along the main beam 26 and are configured to independently move along the main beam 26 along three axes. Specifically, each transfer head 22 is configured to independently move along a transfer axis AT (extending horizontally in FIG. 5), a lift axis AL (extending vertically in FIG. 7), and a clamp axis AC (extending horizontally in FIG. 7). The stations 12 of the production line 10 are spaced along the transfer axis AT. The lift axis AL is orthogonal to the transfer axis AT and the clamp axis AC and, likewise, the clamp axis AC is orthogonal to the transfer axis AT and the lift axis AL.

Each transfer head 22 includes a lift assembly 30 and a clamp arm 32 each moveable relative to each other and relative to the frame 20. The lift assembly 30 includes a lift carriage 34 coupled to the main beam 26 and a lift tower 36 coupled to the lift carriage 34.

Each of the transfer heads 22 is suspended from the main beam 26 and extends downwardly from the main beam 26 beneath the main beam 26. Specifically, each lift carriage 34 is suspended from the main beam 26 and is slideably coupled to the main beam 26 along the transfer axis AT. The lift tower 36 extends downwardly from the lift carriage 34 and is slideably coupled to the lift carriage 34 along the lift axis AL. The clamp arm 32 is suspended from the lift tower 36 beneath the lift tower 36 and is slideably coupled to the lift tower 36 along the clamp axis AC.

As such, each transfer head 22 is selectively moved outwardly (i.e., away from the respective station 12 along the clamp axis AC), upwardly (i.e., away from the respective station 12 along the lift axis AL), and sideways (i.e., away from the respective station 12 along the transfer direction AT) away from the stations 12 to provide quick and easy access to the stations 12 from the substrate 60. Specifically, the lift carriage 34 is selectively moved sideways, the lift tower 36 is selectively moved upwardly, and the clamp arm 32 is selectively moved outwardly to provide access to the stations 12 from the substrate 60. Accordingly, since the main beam 26 is suspended above the stations 12 and the transfer heads 22 are suspended from the main beam 26, the transfer heads 22 can be cleared away from the stations 12 so that an operator can easily approach the stations 12 by walking on the substrate 60. Similarly, when the transfer heads 22 are cleared away from the stations 12, tools and equipment can be brought to the stations 12 along the substrate 60 for maintenance and/or repair of the substrate 60. Access to the stations 12 also allows for easy station changes, e.g., replacing one mold with another. Since the transfer heads 22 are suspended overhead, the substrate 60 in front of the stations 12 is typically flat for ease of access.

Figure 7:
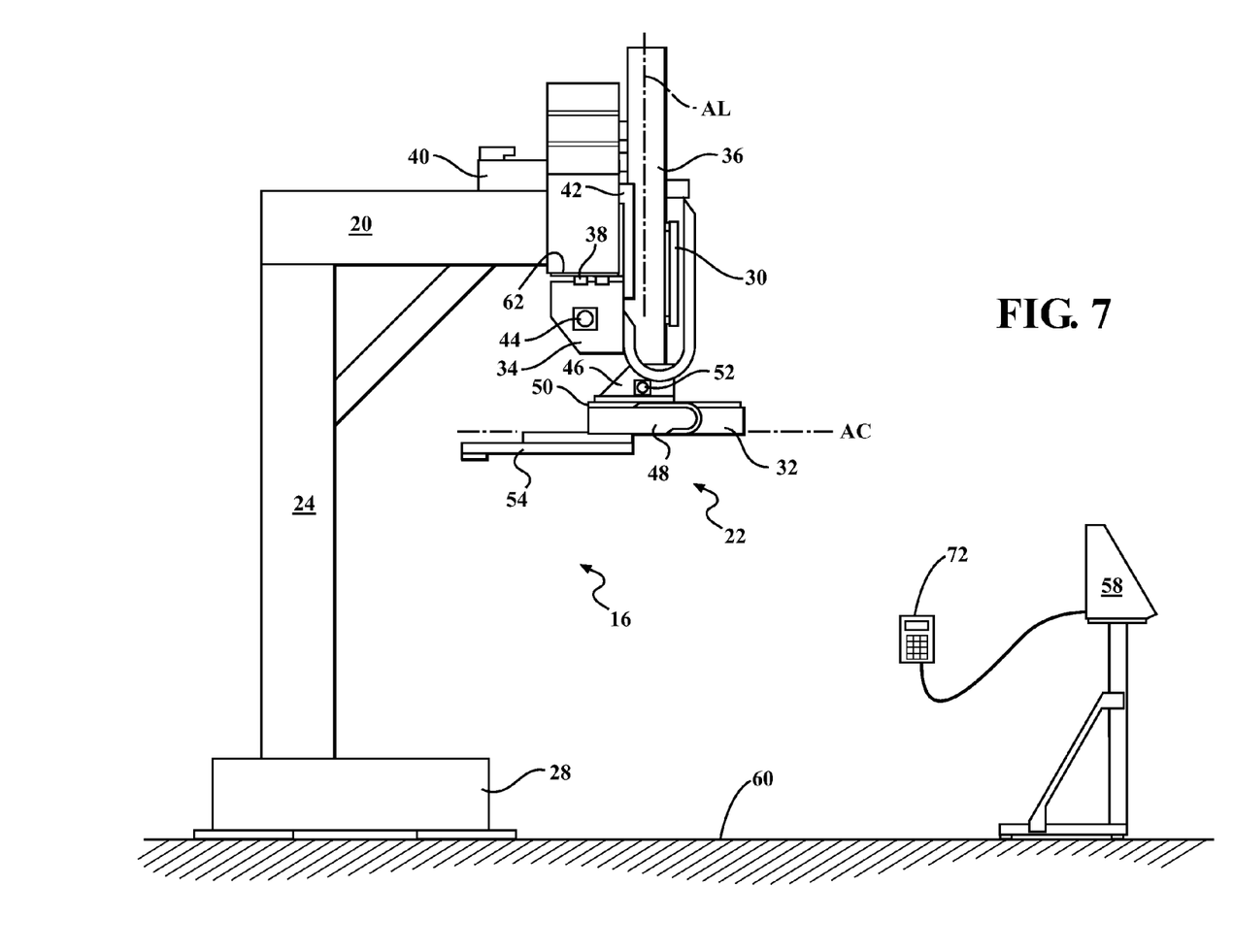
FIG. 7 is a side view of the transfer system.

The main beam 26 presents a bottom surface 62 and each lift carriage 34 is suspended from the bottom surface 62 beneath the main beam 26. As best shown in FIG. 7, transfer linear bearings 38 extend between the main beam 26 and the lift carriage 34. The transfer linear bearings 38 are typically mounted to the bottom surface 62 of the main beam 26. The transfer linear bearings 38 extend along the transfer axis AT so that the lift carriage 34 can move along the transfer linear bearings 38 relative to the main beam 26 along the transfer axis AT.

Figure 6:
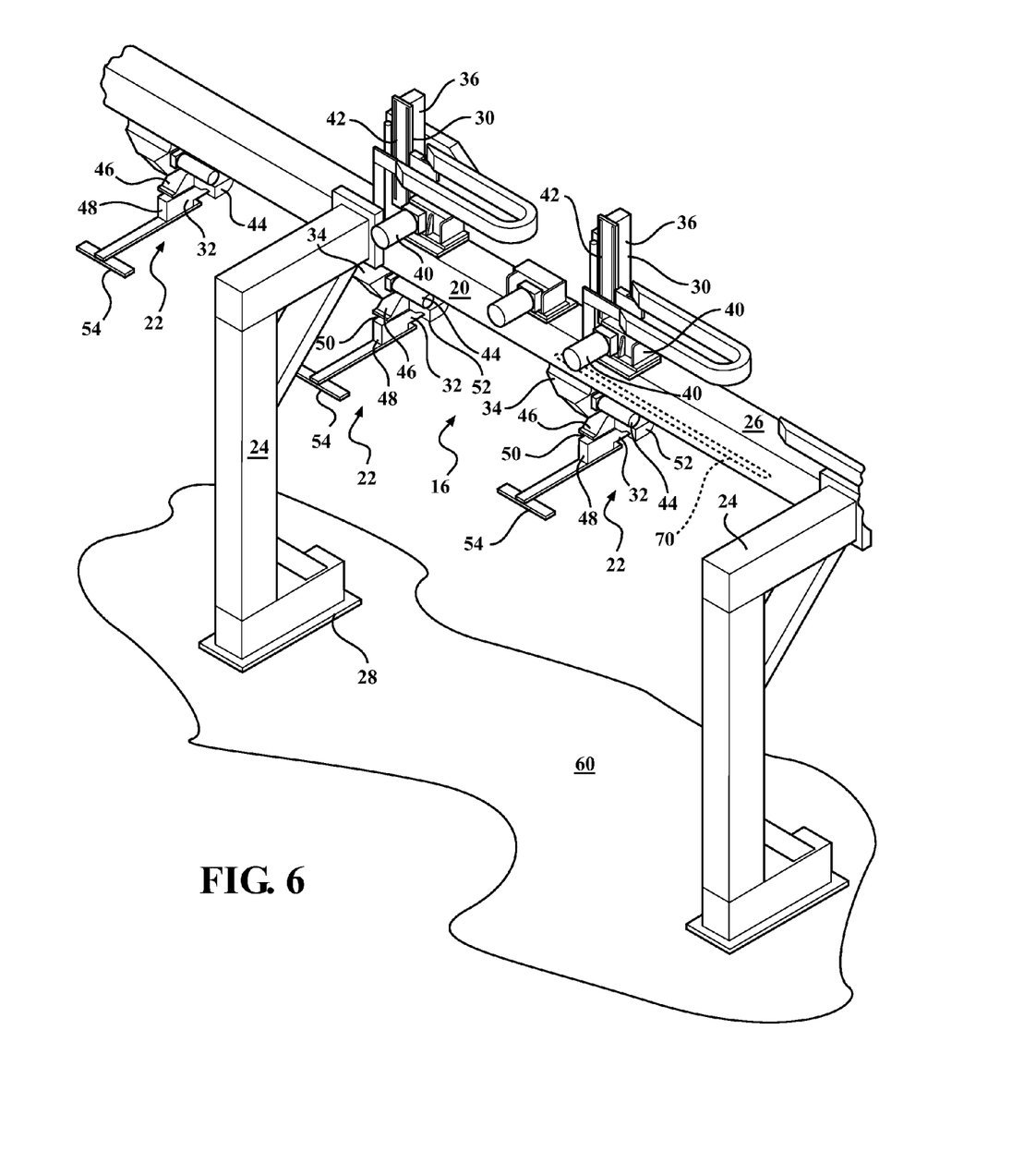
FIG. 6 is a rear perspective view of a portion of the transfer system.

With reference to FIG. 6, each transfer head 22 includes a transfer motor 40 fixed on the main beam 26. The transfer motor 40 selectively moves the lift carriage 34 along the transfer linear bearings 38. Each transfer head 22 includes motion transmitting system 64 connected to the lift carriage 34 and the transfer motor 40 for moving the transfer head 22 along the transfer axis AT. Each of the motion transmitting systems are independently operable to independently move the transfer heads along the main beam.

Figure 5:
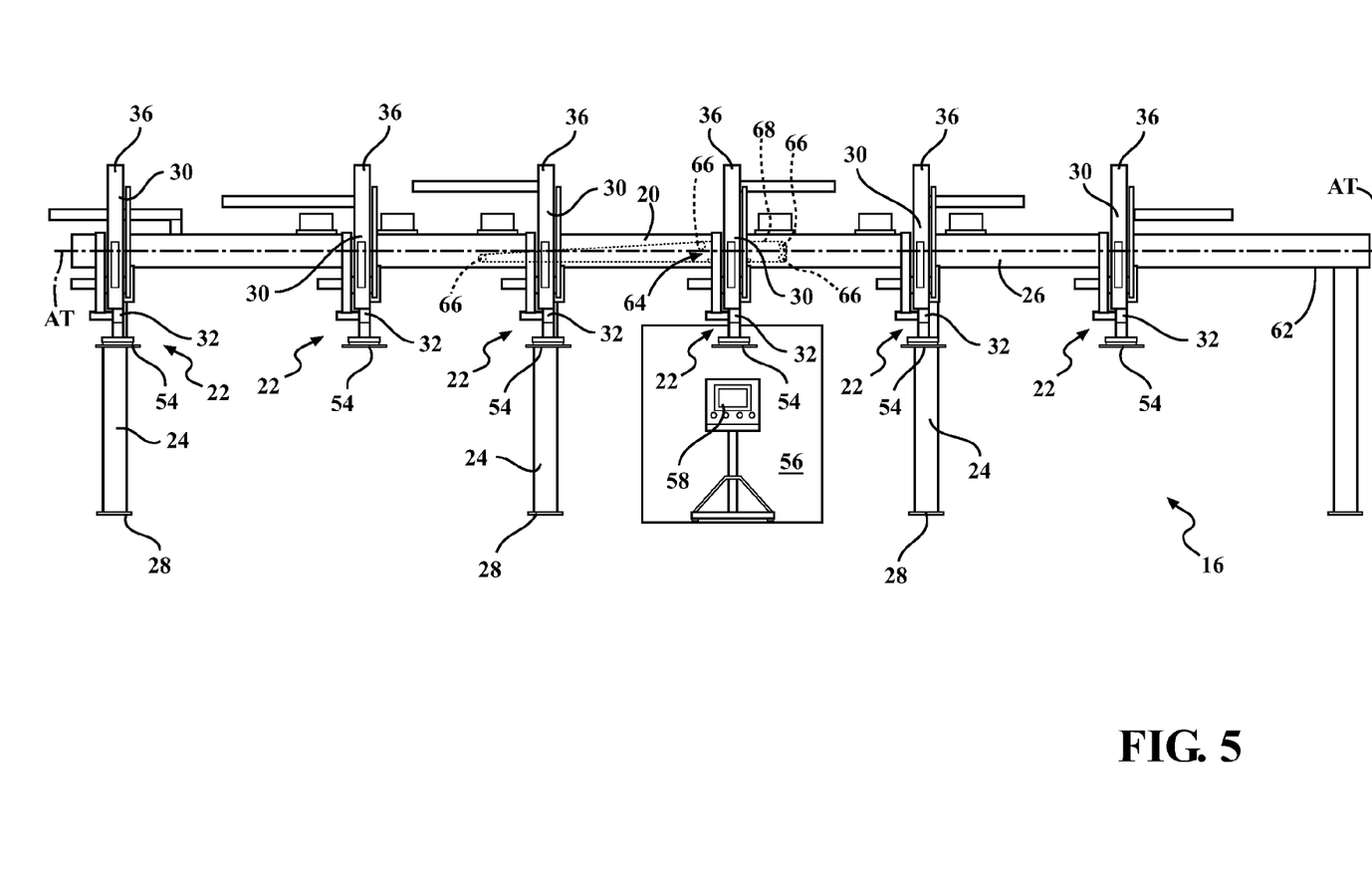
FIG. 5 is a front view of the transfer system.

As one example, the motion transmitting system includes pulleys 66 and a belt 68, as shown in FIG. 5. The belt 68 connects the transfer motor 40 to the lift carriage 34. The pulleys 66 are mounted to the transfer motor 40, the main beam 26, and/or the lift carriage 34 and the pulleys 66 guide the belt 68 from the transfer motor 40 to the lift carriage 34. The motion transmitting system 64 can include any number of pulleys 66 and belts 68 without departing from the nature of the present invention.

With reference to FIG. 5, the main beam 26 is typically hollow and each motion transmitting system 64 is typically disposed in the main beam 26. Such a configuration with the motion transmitting system 64 is disposed in the main beam 26 reduces the size of the transfer system 16. Also, the main beam 26 protects the moving components of the motion transmitting system 64.

The main beam 26 includes a slot 70 through which at least one of the belt 68 and the lift carriage 34 extends. As best shown in FIG. 7, the lift carriage 34 is disposed to the exterior of the main beam 26 and belt 68 extends through the slot 70.

Alternatively, although not shown in the Figures, the lift carriage 34 extends upwardly into the main beam 26 through the slot 70 to the belt 68.

As best shown in FIGS. 6 and 7, lift linear bearings 42 extend between the lift carriage 34 and the lift tower 36. The lift linear bearings 42 extend along the lift axis AL so that the lift tower 36 can move along the lift linear bearings 42 relative to the lift carriage 34 along the lift axis AL.

A lift motor 44 is mounted to the lift carriage 34. The lift motor 44 is connected to the lift carriage 34 with, for example, a system of pulleys and timing belts (not shown). The lift motor 44 selectively moves the lift tower 36 along the lift linear bearings 42.

The clamp arm 32 includes a drive mount 46 mounted to the lift tower 36 and a moveable member 48 moveably supported by the drive mount 46. Specifically, clamp linear bearing bearings 50 extend between the drive mount 46 and the moveable member 48.

A clamp motor 52 is mounted to the drive mount 46. The clamp motor 52 is connected to the moveable member 48 with, for example, a system of pulleys and timing belts (not shown). The clamp motor 52 selectively moves the moveable member 48 relative to the drive mount 46.

As shown in FIGS. 1A-7, an end effecter 54 is mounted on the moveable member 48 of the clamp arm 32 of each transfer head 22 for engaging the workpiece 14 to move the workpiece 14 between stations 12. The end effecter 54 can include, for example, fingers, clamps, suction cups, etc., for supporting the workpieces 14 between the stations 12. The end effecter 54 can also rotate to flip a workpiece 14 as shown in the right-most press shown in FIG. 3.

Figure 4:
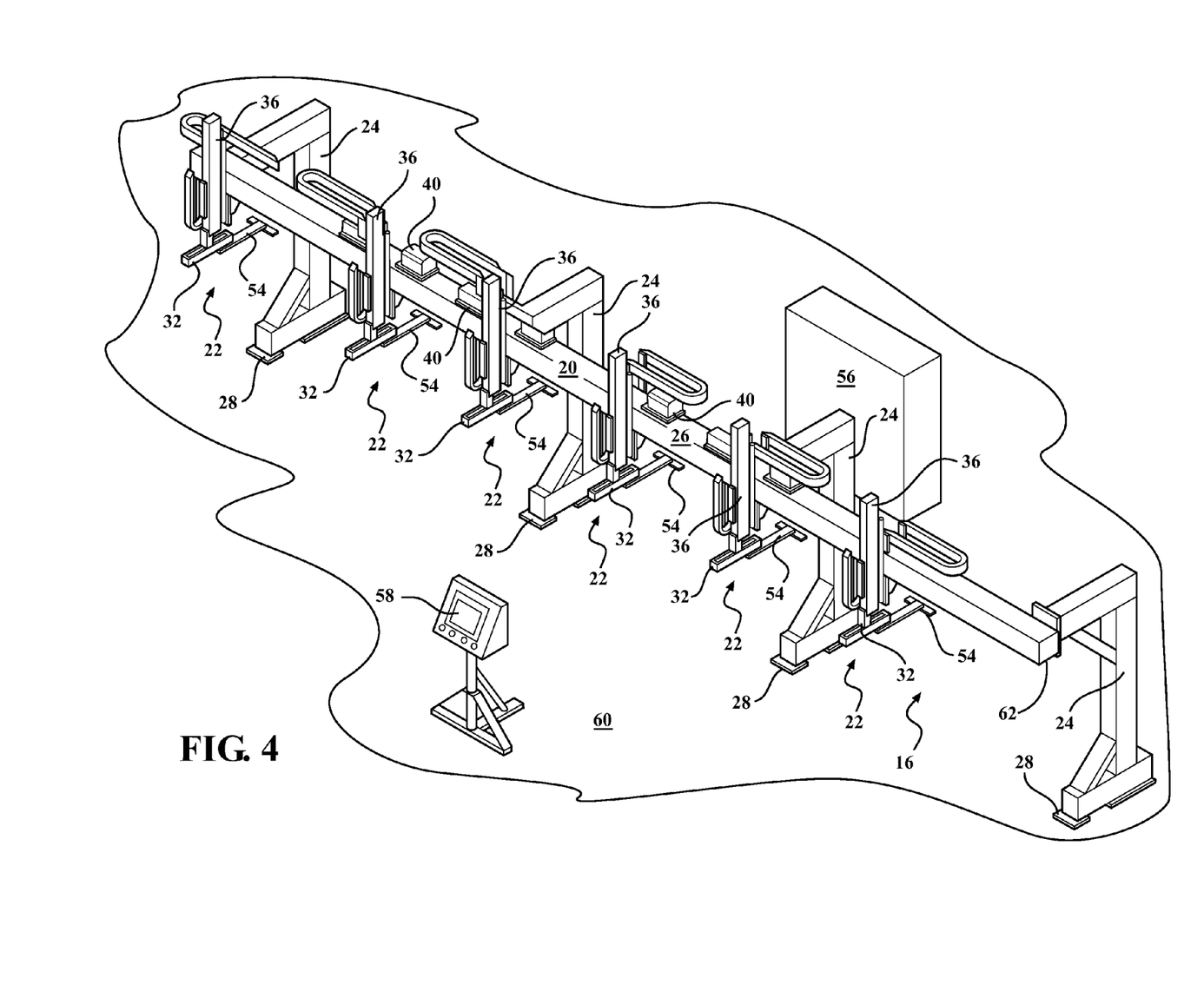
FIG. 4 is a front perspective view of the transfer system.

A central computer 56 is in communication with each transfer head 22 to independently control positioning of each transfer head 22 along the transfer axis AT, the lift axis AL, and the clamp axis AC. With reference to FIG. 4, the central computer 56 can be supported on the substrate; however, the central computer 56 can be disposed at any suitable location without departing from the nature of the present invention. The central computer 56 can be in communication with the transfer heads 22 by wires or by wireless communication components. An interface 58 to the central computer 56 can be spaced from the central computer 56 as shown in FIGS. 4, 5, and 7. An operator can monitor the production line 10 on the interface 58 and/or can control the operation and movement of the production line 10 on the interface 58.

The central computer 56 can be programmed to provide signals to the transfer motor 40, the lift motor 44, and the clamp motor 52 of each transfer head 22 to control the position of each transfer head 22 during the manufacturing process. The central computer 56 is typically programmed after the stations 12 and the transfer system 16 are assembled and installed. The central computer 56 can also be subsequently reprogrammed to optimize the movement and timing of each transfer head 22.

The central computer 56 includes a control terminal 72 for programming the central computer 56 to automatically move each transfer head 22 to transfer workpieces 14 between adjacent stations 12. The control terminal 72 is sometimes referred to as a "teach pendant" in industry. The control terminal 72 is configured to receive instructions from an operator to independently move each transfer head 22 along the transfer axis AT, lift axis AL, and/or clamp axis AC to move workpieces 14 between adjacent stations 12. The operator inputs the instructions to move the transfer head 22 via buttons and/or a joystick on the control terminal 72. The control terminal 72 relays the instructions to the rest of the central computer 56, which in turn provides signals to the transfer head 22 to move the transfer head 22.

The operator uses the control terminal 72 to move one transfer head 22 at a time. The operator watches the position of the transfer head 22 and adjusts the position of the transfer head 22 to move the transfer head 22 from one station 12 to another. In other words, the operator simulates the motion that the transfer head 22 takes to transfer the workpiece 14 between stations 12. The central computer 56 memorizes the instructions for automating transfer of the workpieces 14 between the stations 12. The operator repeats these previous steps for each transfer head 22 so that the central computer 56 memorizes the movement of each transfer head 22 during the manufacturing process.

Since each transfer head 22 includes its own transfer motor 40, lift motor 44, and clamp motor 52 and because each transfer head 22 is independently spaced from each other along the main beam 26, each transfer head 22 can be independently moved along all three axes AP, AC, AL. As such, each transfer head 22 can be programmed to accommodate for variations in spacing between each station 12 along any or all three axes AP, AC, AL. In other words, each station 12 can be installed in the factory without aligning the stations 12 with each other along the three axes AP, AC, AL. By eliminating the need for aligning each station 12 along the three axes AP, AC, AL, assembly time, installation time and manpower are reduced thereby reducing costs.

Further, the independent movement of each transfer head 22 increases the overall speed of the transfer system 16. In other words, all of the transfer heads 22 can simultaneously move along the various axes AP, AC, AL without delaying movement of the other transfer heads 22.

The independent movement of each transfer head 22 also reduces the cycle time of the transfer system 16 because the transfer head 22 that loads the first press, i.e., the left-most press in FIGS. 1A-2B, and the transfer head 22 that unloads the last press, i.e., the right-most press in FIGS. 1A-2B, can move independently as the other transfer heads 22 move workpieces 14 between the other stations 12. In other words, the transfer heads 22 at the first press and the last press can move further or shorter distances than the other transfer heads 22, can move while the other transfer heads 22 are stationary, and/or can move in opposite directions from the other transfer heads 22 to pick up a blank workpiece 14 or drop off a completed workpiece 14. The transfer heads 22 at the first press and the last press can also perform these functions while the stations 12 are operating. As such, the steps of picking up a blank workpiece 14 or dropping off a completed workpiece 14 does not slow the cycle time of the transfer system 16 and the stations 12.

Figure 1A:
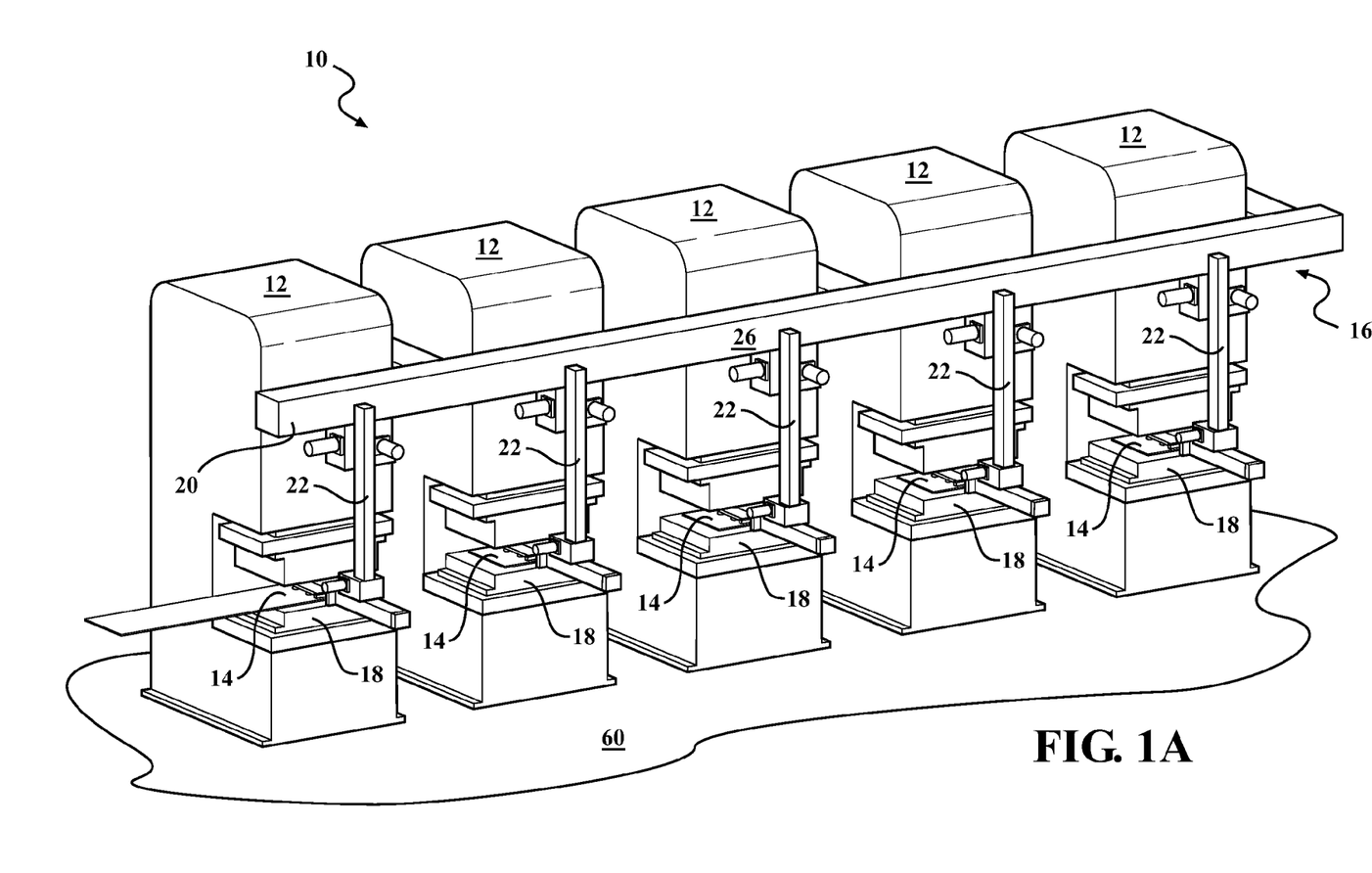
FIG. 1A is a perspective view of a press line of a first embodiment including a plurality of presses and a transfer system in a first position.
Figure 1B:
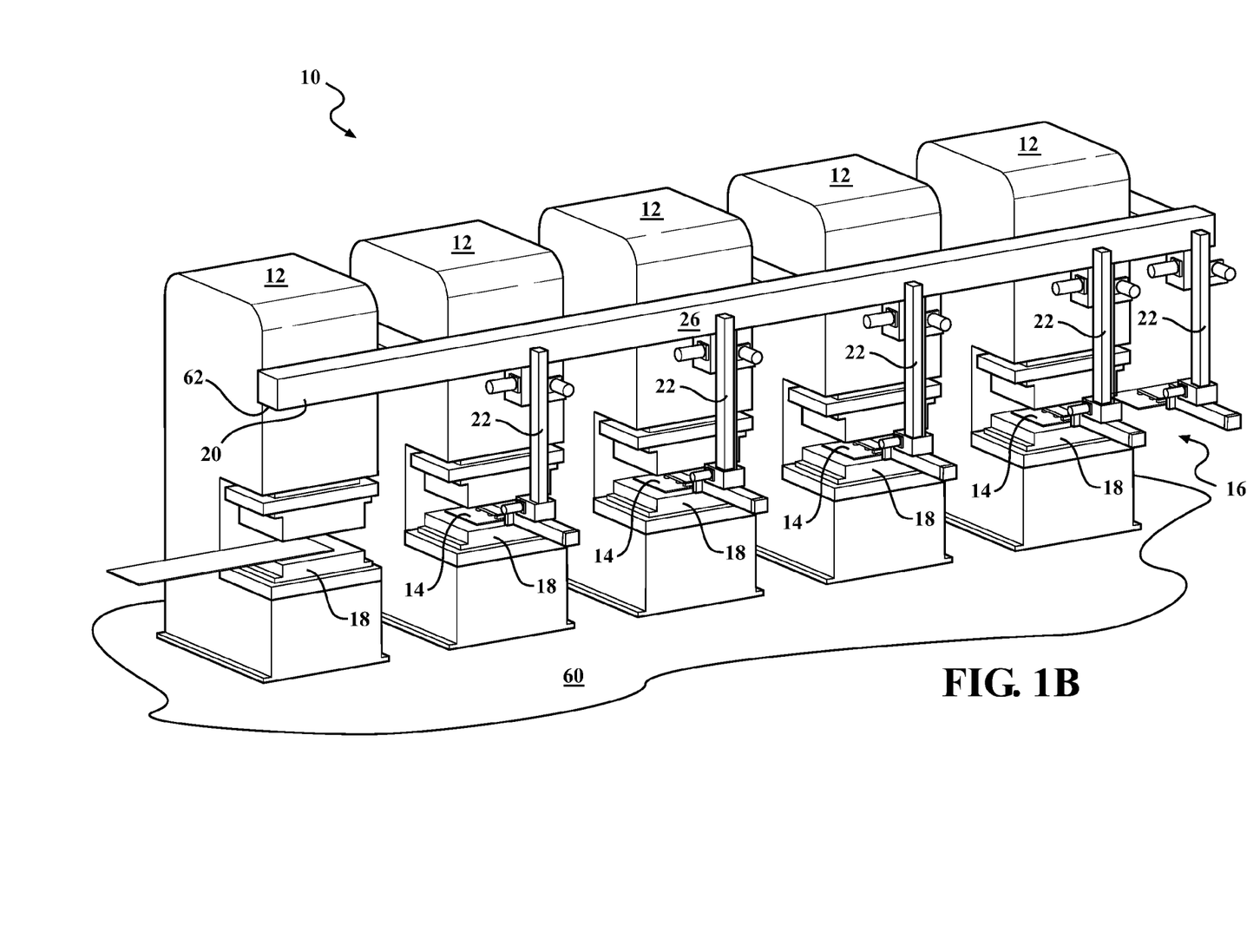
FIG. 1B is a perspective view of a press line of a first embodiment including a plurality of presses and a transfer system in a second position.
Figure 2A:
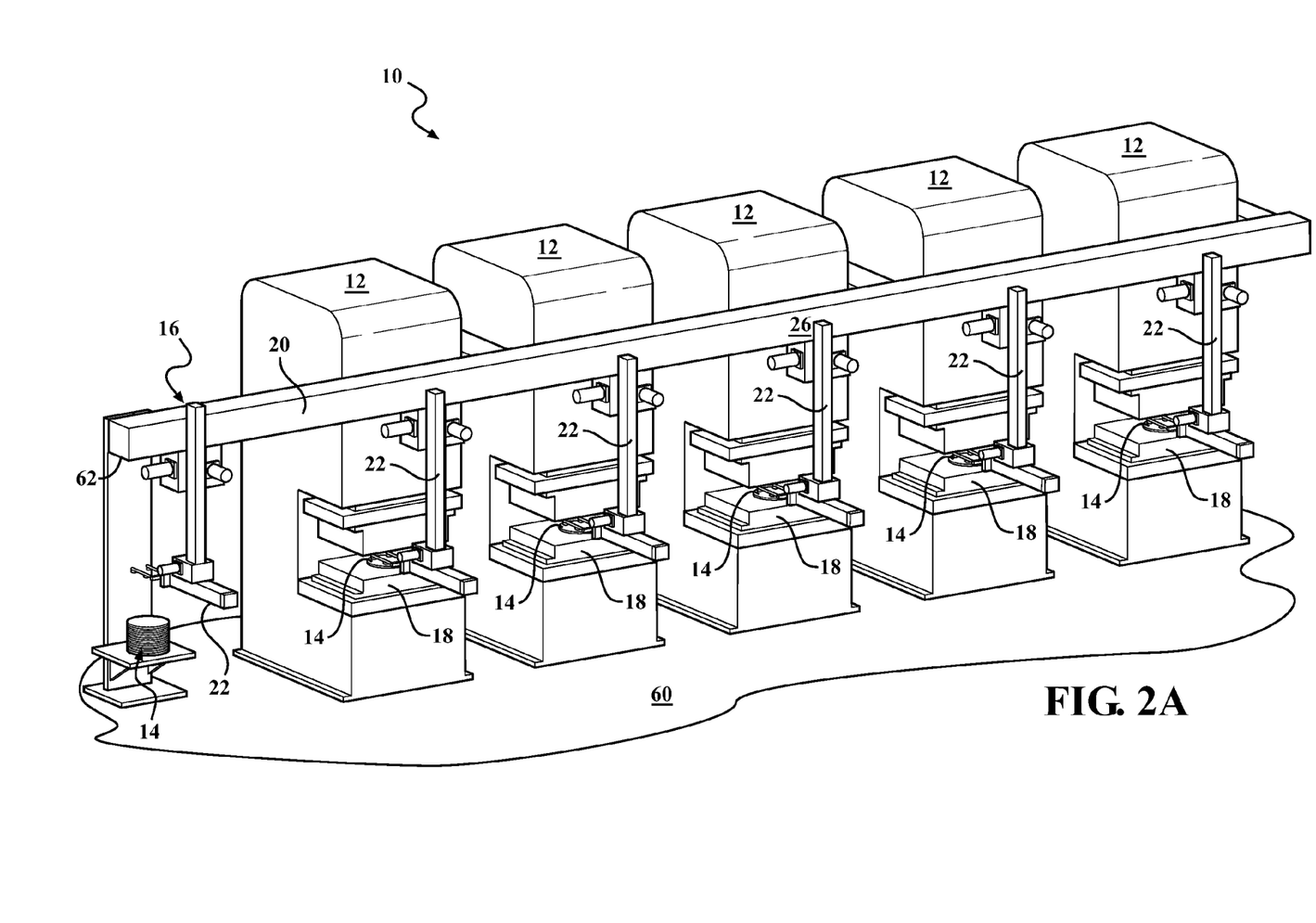
FIG. 2A is a perspective view of a press line of a second embodiment including a plurality of presses and a transfer system in a first position.
Figure 2B:
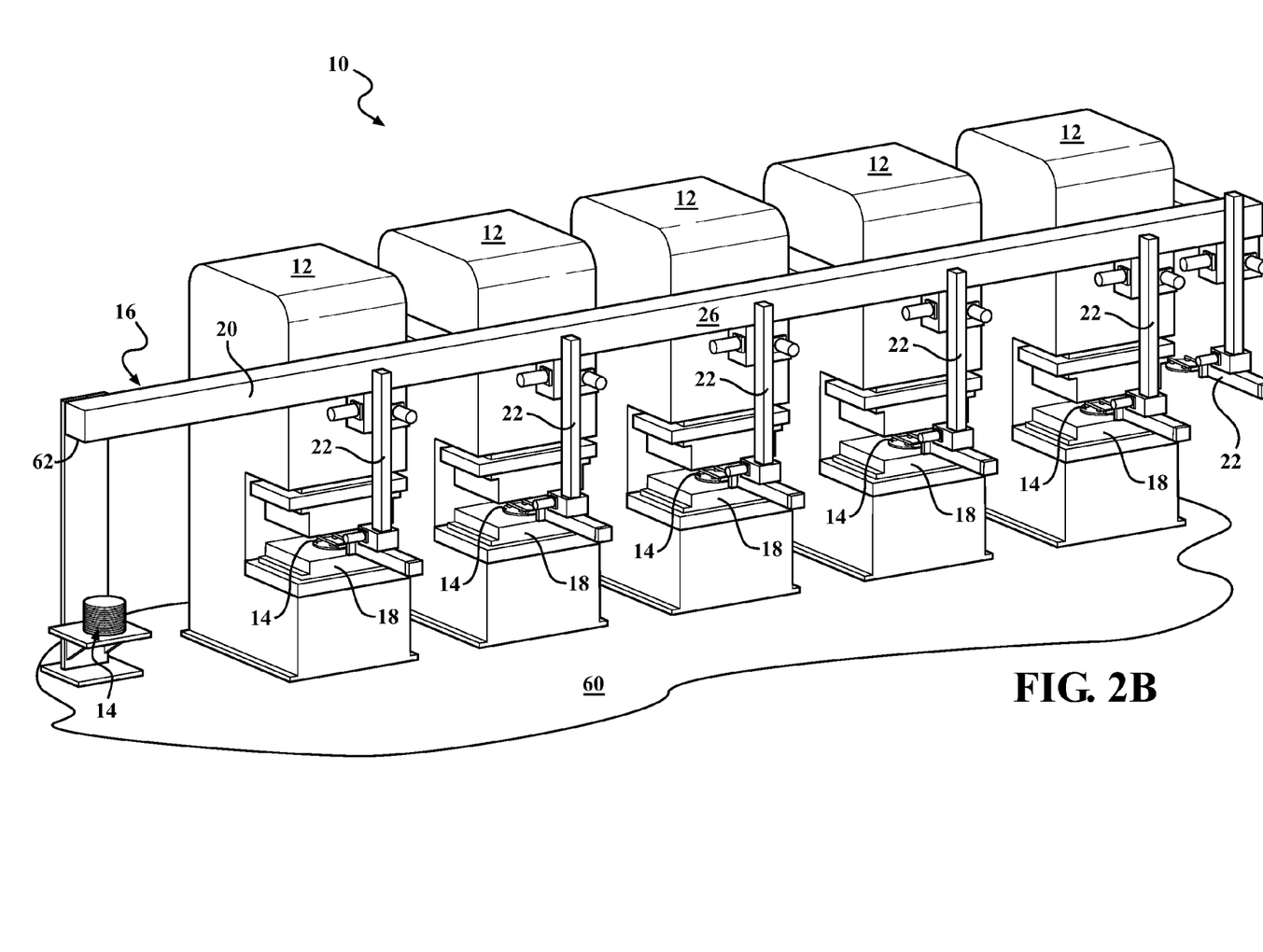
FIG. 2B is a perspective view of a press line of a second embodiment including a plurality of presses and a transfer system in a second position.
Figure 3:
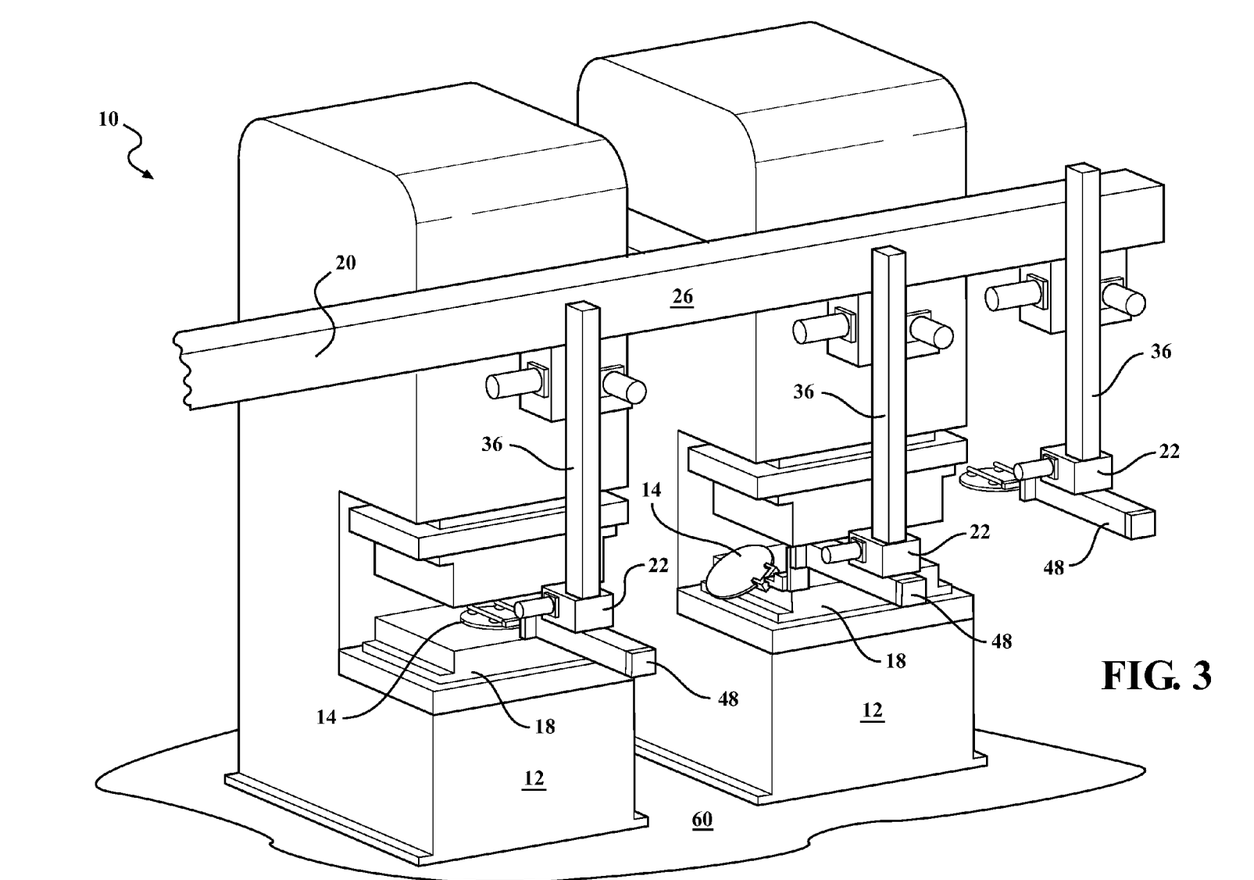
FIG. 3 is a perspective view of a portion of the press line of FIG. 2.

A first embodiment of the production line 10 is shown in FIGS. 1A and 1B. In the first embodiment, material for the workpiece 14 is in the form of a continuous sheet. The left-most transfer head 22 in FIGS. 1A and 1B moves a portion of the continuous piece into the left-most press, which cuts the workpiece 14 from the continuous piece. A second embodiment of the production line 10 is shown in FIGS. 2A and 2B. In the second embodiment, a plurality of workpieces 14 are pre-cut and stacked in a loader. The left-most transfer head 22 lifts a workpiece 14 from the loader and moves the workpiece 14 to the left-most press.

FIGS. 1A and 1B show two extreme positions of the transfer heads 22 of the first embodiment. In FIG. 1A, each of the stations 12 has completed a cycle that performed a manufacturing process to the workpiece 14 on the station 12. During the cycle of the stations 12, the molds 18 of the station 12 come together and, during that time, the transfer heads 22 are positioned away from the molds 18, i.e., not between the molds 18. In FIG. 1A, the molds 18 are separated and the transfer heads 22 have moved toward the workpieces 14 so that the end effectors 54 can engage and move the workpieces 14. As shown in FIG. 1B, each transfer head 22 has moved one workpiece 14 to an adjacent station 12, i.e., in FIG. 1B the workpieces 14 were moved one press to the right in comparison with FIG. 1A. The workpiece 14 from the right-most press is removed and ready to be placed in on a rack, conveyor belt, etc. After the position shown in FIG. 1B, the workpieces 14 are moved from between the molds 18 and the press is cycled to perform the manufacturing process. As this process is repeated, every workpiece 14 is moved to each press and each press performs a manufacturing process on the workpiece 14.

FIGS. 2A and 2B show two extreme positions of the transfer heads 22 of the second embodiment. In FIG. 2A, each of the stations 12 has completed a cycle that performed a manufacturing process to the workpiece 14 on the station 12. During the cycle of the press, the molds 18 of the press come together and, during that time, the transfer heads 22 are positioned away from the molds 18, i.e., not between the molds 18. In FIG. 2A, the molds 18 are separated and the transfer heads 22 have moved toward the workpieces 14 so that the end effectors 54 can engage and move the workpieces 14. As shown in FIG. 2B, each transfer head 22 has moved one workpiece 14 to an adjacent press, i.e., in FIG. 2B the workpieces 14 were moved one press to the right in comparison with FIG. 2A. The workpiece 14 from the right-most press is removed and ready to be placed in on a rack, conveyor belt, etc. After the position shown in FIG. 2B, the workpieces 14 are moved from between the molds 18 and the press is cycled to perform the manufacturing process. As this process is repeated, every workpiece 14 is moved to each press and each press performs a manufacturing process on the workpiece 14.

The invention has been described in an illustrative manner, and it is to be understood that the terminology which has been used is intended to be in the nature of words of description rather than of limitation. Many modifications and variations of the present invention are possible in light of the above teachings, and the invention may be practiced otherwise than as specifically described.

What is claimed is:

1. A transfer system for transferring a workpiece between stations of a production line spaced along a transfer axis, said transfer system comprising:

a frame including at least one riser for connection to an underlying substrate and a main beam fixed to said riser and extending transversely to said riser along the transfer axis; and a plurality of transfer heads spaced along said main beam with each of said transfer heads configured to independently move along said main beam along the transfer axis and relative to said main beam along a lift axis orthogonal to the transfer axis and a clamp axis orthogonal to the transfer and lift axes to accommodate for variation in spacing between each of the stations;

each of said transfer heads being suspended from said main beam and extending downwardly from said main beam beneath said main beam so that said transfer head is selectively moved outwardly, upwardly, and sideways away from the stations to provide access to the stations from the substrate;

wherein each of said transfer heads includes a lift carriage moveably supported by said main beam, a transfer motor fixed to said main beam, and a motion transmitting system supported by said main beam and connected to said lift carriage and said transfer motor for moving said transfer head along the transfer axis;

wherein each of said motion transmitting systems are independently operable to independently move said transfer heads along said main beam;

wherein said main beam is hollow and said motion transmitting system of each transfer head is dispose in said main beam;

wherein each of said motion transmitting systems includes pulleys and a belt wherein said main beam includes a slot through which at least one of said belt and said lift carriage extends;

wherein said main beam presents a bottom surface with each lift carriage suspended from said bottom surface beneath said main beam, said bottom surface defining said slot.

\* \* \* \* \*